(12) United States Patent
Guiraud et al.

(10) Patent No.: US 8,283,750 B2
(45) Date of Patent: Oct. 9, 2012

(54) ELECTRONIC DEVICE HAVING ELECTRODE WITH HIGH AREA DENSITY AND IMPROVED MECHANICAL STABILITY

(75) Inventors: Lionel Guiraud, Blainville sur Orne (FR); Francois Lecornec, Luc sur Mer (FR); Johan H. Klootwijk, Eindhoven (NL); Freddy Roozeboom, Waalre (NL); David D. R. Chevrie, Bretteville sur Odon (FR)

(73) Assignee: IPDIA, Caen (FR)

( * ) Notice: Subject to any disclaimer, the term of this patent is extended or adjusted under 35 U.S.C. 154(b) by 452 days.

(21) Appl. No.: 12/299,325

(22) PCT Filed: Apr. 30, 2007

(86) PCT No.: PCT/IB2007/051598
§ 371 (c)(1),
(2), (4) Date: Nov. 3, 2008

(87) PCT Pub. No.: WO2007/125510
PCT Pub. Date: Nov. 8, 2007

(65) Prior Publication Data
US 2010/0230787 A1    Sep. 16, 2010

(30) Foreign Application Priority Data
May 2, 2006  (EP) .................................. 06300422

(51) Int. Cl.
*H01L 29/00* (2006.01)
(52) U.S. Cl. ................. 257/528; 257/534; 257/E21.646; 257/E27.089
(58) Field of Classification Search .................. 257/532, 257/E27.048
See application file for complete search history.

(56) References Cited

U.S. PATENT DOCUMENTS

| | | | |
|---|---|---|---|
| 3,906,296 A | | 9/1975 | Maserjian et al. |
| 5,204,280 A | | 4/1993 | Dhong et al. |
| 5,245,505 A | | 9/1993 | Shiga et al. |
| 5,256,588 A | | 10/1993 | Witek et al. |
| 5,336,630 A | * | 8/1994 | Yun et al. ................. 438/253 |
| 5,405,799 A | * | 4/1995 | Woo et al. ................. 438/396 |
| 5,739,060 A | | 4/1998 | Chao |
| 5,821,142 A | | 10/1998 | Sung et al. |
| 5,985,729 A | | 11/1999 | Wu |
| 6,924,526 B2 | | 8/2005 | Fukuda et al. |
| 6,960,504 B2 | | 11/2005 | Park |
| 2004/0056295 A1 | | 3/2004 | Agarwal et al. |
| 2004/0251485 A1 | | 12/2004 | Kito et al. |

FOREIGN PATENT DOCUMENTS

DE   10358299 A1   7/2005

(Continued)

*Primary Examiner* — Ha T. Nguyen
*Assistant Examiner* — Raj R Gupta
(74) *Attorney, Agent, or Firm* — Hamre, Schumann, Mueller & Larson, P.C.

(57) ABSTRACT

The invention relates to an electric device including an electric element, the electric element comprising a first electrode (104) having a first surface (106) and a pillar (108), the pillar extending from the first surface in a first direction (110), the pillar having a length measured from the first surface parallel to the first direction, the pillar having a cross section (116) perpendicular to the first direction and the pillar having a sidewall surface (120) enclosing the pillar and extending in the first direction, characterized in—that, the pillar comprises any one of a score (124) and protrusion (122) extending along at least part of the length of the pillar for giving the pillar (108) improved mechanical stability. The electrode allows electrical elements such as capacitors, energy storage devices or diodes to be made with improved properties in a cost effective way.

15 Claims, 12 Drawing Sheets

FOREIGN PATENT DOCUMENTS

| | | | |
|---|---|---|---|
| DE | 10358299 A1 * | 7/2005 | |
| EP | 20050110488 | 5/2007 | |
| WO | 2004/114397 | 12/2004 | |
| WO | 2005/027245 | 3/2005 | |
| WO | 2007/054858 A1 | 5/2007 | |

* cited by examiner

ELECTRONIC DEVICE HAVING ELECTRODE WITH HIGH AREA DENSITY AND IMPROVED MECHANICAL STABILITY

The present invention relates to an electric device including an electric element, the electric element comprising a first electrode having a first surface and a pillar, the pillar extending from the first surface in a first direction, the pillar having a length measured from the first surface parallel to the first direction, the pillar having a cross section perpendicular to the first direction and the pillar having a sidewall surface enclosing the pillar in the first direction.

The cost per semiconductor substrate area in combination with the need for large capacitances to be implemented in applications such as for example RF integrated circuits requires capacitors to have ever increasing capacitance density. Hereinafter, density is defined as the capacitance per unit semiconductor substrate area. It is known in the art that three-dimensional (3D) electrodes may serve to reach this goal. For example, U.S. Pat. No. 5,245,505 discloses rod-shaped pillar-like conductors arranged upright on a first layer conductor for use in capacitors.

To increase the capacitance density, the aspect ratio of a pillar, which is defined as its length divided by its smallest cross-sectional dimension measured perpendicularly to its length direction, may be increased. The obvious strategy is to increase the length of the pillar. Alternatively, or in addition, the cross-sectional dimensions or footprint of the pillar may be decreased. This allows more pillars to be packed together on the same substrate area. However, a pillar with high aspect ratio becomes susceptible to breaking and/or toppling over when subjected to shear forces occurring for example during handling and/or processing. This obstructs the increase of the capacitance density according to the aforementioned strategy, thereby limiting the capacitors field of application.

The problem has been addressed in US 2004/0056295 A1. The document discloses semiconductor devices having structurally stabilized, tall capacitors having three-dimensional architectures. The capacitors include monolithically fabricated upright microstructures having large aspect ratios. The structures are mechanically reinforced against shear forces and the like by a brace layer that transversely extends between lateral sides of at least two of the freestanding microstructures. The brace layer is formed as a micro bridge type structure spanning between the upper ends of the two or more microstructures.

The disclosed device has the disadvantage that manufacturing of the braces requires a masking process step in a semiconductor process, which is costly.

It is an object of the present invention to provide an electrode with an increased electrode area density through the use of a pillar with a high aspect ratio, which is capable of withstanding processing conditions during manufacturing and handling, but does not require additional process steps for its manufacture.

The object is realized in that the pillar comprises any one of a score and protrusion extending along at least part of the length of the pillar, giving the pillar improved mechanical stability.

The invention is based on the insight that mechanical stabilization of a pillar does not require auxiliary support structures per se. Instead, it may be accomplished by giving the pillar a shape such that its cross section is profiled in a specific way. Analogous reinforcement of beams is done by shaping them into sectioned beams having profiles such as for example an H, L T, X or the like. The underlying principle is that, from two beams that have the same length, mass and cross-sectional area, the beam having the profiled shape is stronger and stiffer towards bending and twisting than the conventional solid beam without the profile.

The pillar according to the invention has a structure and a cross sectional profile as indicated above by providing it with at least one protrusion in the shape of a flange or fin and/or a score along part of its length. Therewith, the pillar is structurally stabilized, e.g. it is strengthened and stiffened. If the profile extends to the anchoring surface of the of the pillar it is also better anchored to its underground. This increases the resilience of the freestanding pillar towards shear forces or other mechanical load during handling and processing and reduces its susceptibility towards toppling over.

The structural stability of the pillar can be controlled by the number of protrusions and/or scores, the distance over which they extend along the pillar, their arrangement with respect to each other and their shape. This will be further elucidated in the description with respect to FIGS. 1 and 2.

The present invention is further based on the insight that, although manufacturing of a profiled pillar according to methods such as folding of plates or sheets, pressing or scoring solid bars, or attaching flanges to a central pillar portion is difficult in micro-structuring, a pillar with a complicated profile can be made in a relatively simple way. Thereto, a pillar is prepared from a solid part of substrate through etching in the length direction of the pillar using an etch mask having a pattern according to the required cross-sectional profile of the pillar. The profile is adaptable through etch mask design, which is relatively easy and costless. Consequently, the stabilized pillars can be obtained without additional manufacturing process steps, which, in semiconductor industry driven by cost and size, is an important advantage.

When etching is done with directional reactive ion etching (DRIE), an advantage of a pillar according to the present invention is that no brace or support structures are present that obstruct the gas or fluid dynamics during etching and that the diffusion of gaseous reagents and products is limited by Knudsen diffusion as is the case in the inverse structure of trenches in silicon. In addition, if on top of the pillars material layers need to be deposited using for example atomic layer deposition (ALD or chemical vapor deposition (CVD) the same advantages apply.

The autonomous strength of the pillar combined with its shape, results in several advantages for its use in electrodes. These advantages can be exploited individually or in combinations as elucidated below.

It is an advantage of a pillar according to the present invention that it does not need a support structure to keep it upright, in place or otherwise in tact, the pillar allows use in freestanding fashion. In contrast, a microstructure according to for example US 2004/0056295 A1 requires at least one additional such microstructure, or another structure for anchoring the microstructure to. Thus, a pillar according to the invention may be used on its own and on a surface that lacks suitable anchoring structures. This is advantageous for example when the pillar is not sunk into a substrate, in which situation, rims or side walls of a hole, trench, groove, pore, cavity or the like, wherein the pillar would be sunk, are not available.

A pillar according to the present invention is advantageous when the pillar is not embedded in a solid surrounding. Thus, if the pillar is to be used as an electrode of for example a capacitor, its outer surface may be provided with a dielectric layer and a second electrode layer before the whole capacitive assembly may be embedded in a solid material. Therefore, the strength of the pillar to withstand processing and/or handling conditions is not needed in the end-product when it is embedded, but all the more in manufacturing stages, during which it is still not embedded. However, besides intermediate products during manufacturing, an end-product benefits from the strengthened pillar for the same reasons. Thus, either only the yield is improved (embedded pillars) or yield and mechanical lifetime (non-embedded pillars) are increased.

The pillar according to the invention can be made longer than a conventional one without suffering from the mechanical weakness. Alternatively, when increased length is not needed, the cross sectional dimensions can be decreased without sacrificing strength. While longer pillars lead to an increase of electrode surface area per unit substrate area, due to the pillars increased length, thinner pillars do so by their reduced cross-sectional area.

A further advantage of a pillar according to the invention is related to its profiled shape. The surface area of the sidewall of the pillar with a profiled cross section is substantially larger than that of a comparable pillar of the same mass having a solid non-profiled cross section. Hence, the electrodes' surface area is increased without substantially changing the substrate area occupied by the electrode.

An embodiment of the invention is defined by claim 2. If the first and second regions of the sidewall surface of the pillar have an inclination angle with respect to one another, which is different from 0° or 180°, then their joint line forms a crease. It is advantageous that the inclination angle is obtuse since then the crease is not sharp. Consequently, etching as well as conformal deposition of additional material layers over the crease in the sidewall surface is improved. This is beneficial for the deposition chemistry, which in turn results in more uniform material layer thickness and better quality of the material layer in chemical and/or mechanical and/or electrical sense. This allows for the use of thinner additional material layers and increases the lifetime and reliability of devices. In addition, the etching and the deposition reaction rates are faster, which comprises a beneficial cost factor.

Another embodiment of the invention is defined by claim 3. With respect to the aforementioned improved etching and deposition of additional layers and the electrical properties, it is advantageous that the sidewall surface is smooth. Smoothness stands disconnected from whether creases and/or corners within the sidewall surface correspond to sharp or obtuse angles, since a sharp angle may still be realized by a smoothly curved surface.

The shape of the sidewall surface with respect to corners and creases as well as smoothness can be conveniently controlled through mask design and/or etch condition adjustment.

An embodiment of the invention is defined by claim 4. Herein symmetry is defined as in geometry or group theory. The advantages taken from the symmetry include easy mask design and predictable structural reinforcement of the pillar. Furthermore, processing development and/or processing condition adjustment is facilitated and/or improved.

In the case that the electric device comprises a plurality of elements and/or an element comprises a plurality of electrodes arranged such that an array of spaced apart pillars is formed, the symmetry of the pillars and/or their ordering pattern is preferably chosen such as to maximize the space between pillars without compromising electrode area per unit substrate area. This will enhance etching speed and quality without losing electrode area density. This is further elucidated in the Figure description with reference to FIG. 3. Preferably, in this respect, the symmetry and ordering is further such that the space is also evenly distributed over the array area giving etch speed homogeneity with area.

The advantage of increased space between pillars is related to the effect of aspect ratio dependent etching (ARDE) and 3D freedom of diffusion of reagents. The effect and a limited 3D-diffusion of reagents results in a decreasing etch rate during for example reactive ion etching (RIE) in narrower or deeper trenches, cavities, pores or holes. Hence, a pillar array as described, can be etched in shorter time than a comparative conventional array of pillars, therewith saving time and cost. Alternatively, if the same etch time and cost are used, longer or higher aspect ratio pillars can be obtained.

An embodiment of the invention is defined by claim 5. Such a pillar shape provides the maximum and/or same amount of free space independent of etch depth or pillar length, which is beneficial when forming the pillar using etching in view of the ARDE effect.

An embodiment of the invention is defined by claim 6. Herein, the dimensions of the pillar, perpendicular to the length direction may alter along the length of the pillar such that the shape or profile of the cross section remains the same, i.e. remains congruent. Hence, the pillar may have a larger footprint than its top cross section. This will further increase stability of long pillars.

An embodiment of the invention is defined by claim 7. Due to the improved strength of the pillar according to the invention, it can be made with relatively large aspect ratios. This provides significant increase of the electrode surface area via the pillars sidewall increase at relatively low cost.

In an embodiment as defined by claim 8, the element includes a first electrode comprising a plurality of pillars. The plurality of pillars results in a substantial increase of the first electrode surface area. If the pillars are ordered in an array, preferably the ordering has a symmetry chosen such that a large electrode area per unit substrate area results. Moreover, the symmetry is also such that the space between the ordered pillars is homogeneously distributed between pillars or that space around a pillar is substantially the same, such that process steps such as etching or deposition of material layers covering the entire first electrode surface occur in a controlled way. For example etch speed or deposition speed is substantially evenly distributed over the array area.

An embodiment of the invention is defined by claim 9. The auxiliary layer is sandwiched at least partly between the first and second electrode to separate them physically. Depending on the nature of the electrodes and the auxiliary layer, the element of such a device may have different properties for which a high electrode surface area per unit substrate area is needed. Exemplifying elements include: capacitors, energy storage devices and diodes or the like.

An embodiment of the invention is defined by claim 10. In this embodiment, at least one additional electrode is present between the first and second electrode. The increased available space between pillars according to the invention is advantageous in the light of processing of stacks with increased number of layers. The addition of layers will further enhance the properties of the elements. For example, capacitance and energy storage density of corresponding elements may be increased without having to prepare longer pillars, i.e. without having to etch deeper into a substrate. In case of the capacitor, the capacitance density may be balanced against dielectric layer thickness. Thus, increasing the thickness results in improved breakdown voltages, without decrease of capacitance density, provided one compensates the decrease of capacitance density by simultaneously inserting an extra layer stack onto the pillared substrate. This opens up application areas that require both high capacitance density and high breakdown voltage.

An embodiment of the invention is defined by claim 11. The device comprises at least two elements of the same type, which means elements having the same material components in order to perform the same function, but which may have a different geometric layout. Thus, such elements may be capacitors, similar energy storage devices, diodes or others. When preparing such elements using etching form a solid material, it is preferred that etch depth of all elements is substantially identical. In order to achieve this while preparing such elements, the space between pillars or pillars and edge walls of trenches comprising the pillars, must be kept homogeneously distributed around pillars. Then by using different pillar geometry such that they have different cross sectional profiles in the single elements, it is possible to change the first electrode area available per unit substrate area of an element. This for example enables to prepare capacitors having different capacitance per unit substrate area in the same amount of etch and/or deposition time. It thus results in highly controllable process parameters.

An embodiment of the invention is defined by claim 12. With a semiconductor material, doping can be used to adjust the conductivity of a portion of the semiconductor material to a level that is suitable for letting this portion function as an electrode. Thus, the doping level provides a convenient way of determining the electrode conductivity to the requirements. Furthermore, the type of conductivity is controllable via the doping that may be either n- or p-type. Deposition cost of a conducting layer for the first electrode is avoided as well as possible material incompatibility between substrate and such a deposited electrode layer. The size and shape of the doped portion of the electrode can be controlled via masking during doping or other isolation techniques.

An embodiment of the present invention is defined by claim 13. In this embodiment, the device is an integrated circuit having a memory function. The element according to the invention is a storage capacitor of a dynamic random access memory cell. In such a cell, the capacitor is connected to one of the channel terminals of a selection transistor. The cell is part of an array of cells and integrated into a dynamic random access memory (DRAM) circuit. The available substrate area per memory cell must be minimized. Furthermore, to increase or at least prevent deterioration of data refresh time upon shrinking of features sizes, requires increased capacitance. Therefore, a capacitor according to the invention is then particularly advantageous in that it provides high capacitance per unit substrate area.

An embodiment of the present invention is defined by claim 14. A device according to the present invention may be assembled with one or more other integrated circuits into a ready to use module. In this embodiment, the device according to the invention provides electrical connectivity between the integrated circuits or between at least one of the integrated circuits and an external device. In addition, the device according to the invention offers a specific electrical function that operates in harmony with the functions of the one or more other integrated circuits. Preferably, the specific function is a function that is difficult or expensive to realize within the one or more other integrated circuits.

To realize such functions the device may comprise all sorts of discrete elements such as described above and integrated with other elements such as switches or vertical interconnect areas (vias). In one variation, the device provides a cost effective substitute for surface mounted units (SMU) needed for operation of one or more of the integrated circuits. The module may comprise multiple devices according to the invention each having its own specific electrical function.

These and other aspects of the invention will be further elucidated with reference to the Figures, in which:

FIG. 4B is a cross sectional view of FIG. 4A in the direction of I, while FIG. 4A is a sectional view of FIG. 4B along the line II.

Figure 7:
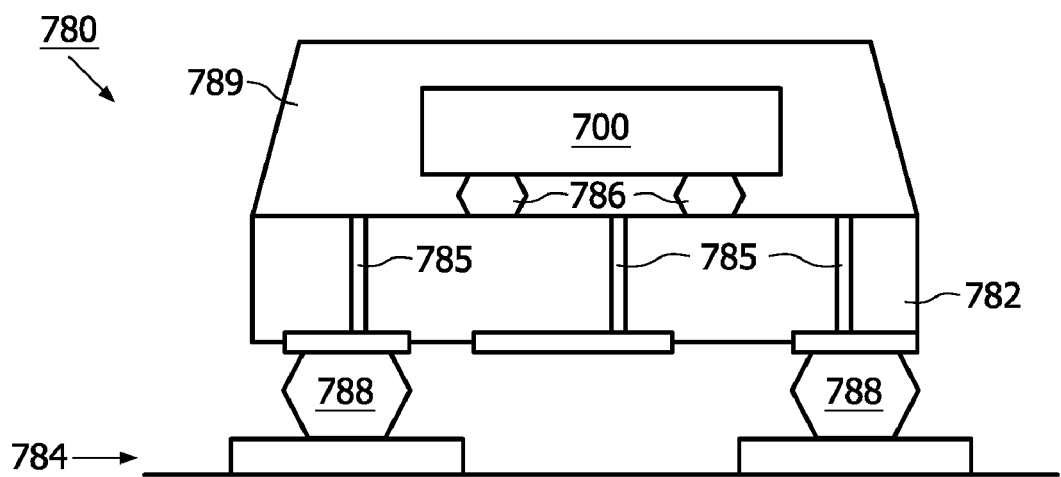

FIG. 7 provides a schematic representation of an assembly comprising a device according to the invention.

With reference to the Figures, the following description elucidates how the structural design of the pillar according to the invention can be used to advantage. A number of exemplary electrical devices or elements is described. The advantages are not limited to the described embodiments, but can be exploited in different devices. Like numerals represent like parts.

The characteristics of an electrode of having a pillar according to the invention are detailed with reference to FIGS. 1A and 1B, which each show an electrode having a pillar. The electrode 104 has a first surface 106, which serves as the underground for the pillar 108. The pillar extends from the first surface 106 with a length L in the first direction 110. The pillar is part of the electrode and has a footprint area 112, which is the base with which it is attached to its underground. The footprint area is not necessarily perpendicular to the first direction. In addition, the first surface is not necessarily larger than the footprint area. An imaginary plane 114 (only shown in FIG. 1A) cutting through the pillar defines a cross section 116 perpendicular to the first direction 110. The cross section has a profile 118 that is identical to the contour line of the cross section. The cross section can be taken at any length position of the pillar and does not need to be constant along the length of the pillar. The pillar has a sidewall surface 120, which in cross sectional view, is represented by the contour line, i.e. the profile 118.

Figure 1A:
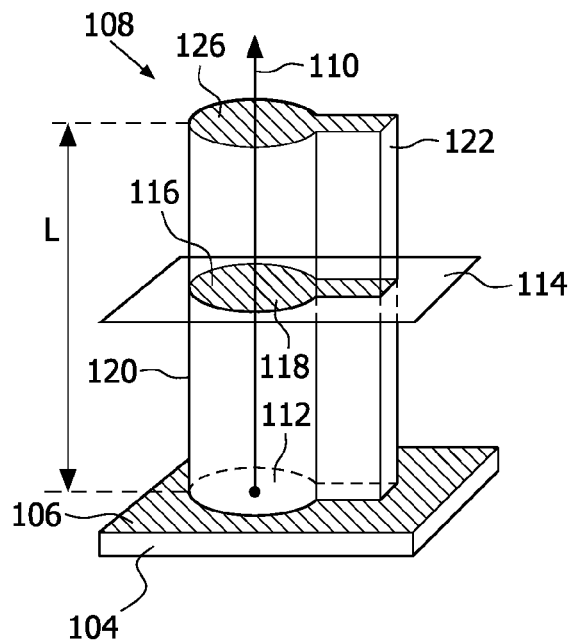
FIGS. 1A and 1B represent electrodes comprising a pillar according to the invention.

The pillar of FIG. 1A has a protrusion 122 extending along its length, resembling a flange or fin. The pillar may be conceived to comprise a central part such as a cylindrically shaped shaft 126 to which the flange or fin is attached. In contrast, the pillar of FIG. 1B has a score 124 along its length, which can also be called a groove. It is noted that the designation of which part of the pillar is the shaft, protrusion or score, is arbitrary and may be done according to whatever is most convenient in describing the pillar. In a number of instances, the shape of a pillar can be equally well-described using scores or protrusions.

Figure 1B:
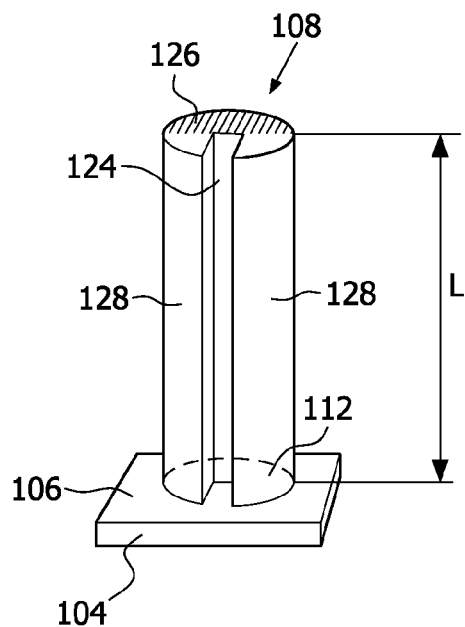

Thus, the pillar of FIG. 1B may also be conceived to comprise a central shaft 126. In FIG. 1B, the shaft 126 has half the cross section of that of FIG. 1A and it has two protrusions, flanges or fins 128 that are part of it. The shaft 126 and the protrusions 122 have shapes that differ from those of the pillar of FIG. 1A. In fact, the shape of shaft 126 and protrusion 122 and/or score 124 of a pillar 108 can be freely chosen to provide a profile 118 as will be further detailed hereafter.

The length over which the protrusion 122 or score 124 extends along the first direction 110 may be chosen as desired. In addition, the position of the protrusion or score with respect to the first direction can be chosen. This is of interest for example, if only a part of the pillar needs reinforcement, or if it simplifies the manufacture of pillars.

The protrusion 122 or score 124 provides the pillar with mechanical stability. Key here is that according to engineering principles, compared to a conventional pillar which lacks the protrusion or score and has a solid non-profiled cross section, the profiled pillar having the same length, mass and density as the conventional pillar, has improved strength and is stiffer towards bending and/or twisting. Thus, by changing the cross sectional profile of the pillar, without changing the overall area of the cross section, the strength of the pillar is increased.

Therefore, the pillar according to the invention can be made with smaller cross sectional dimensions and/or a greater length than a conventional one that is comparable. Defining the aspect ratio of the pillar as its length divided by its smallest cross sectional dimension, the pillar according to the invention can have a higher aspect ratio than a conventional one and still provide better strength. While conventional pillars can have aspect ratios of up to approximately 30, those of a pillar according to the invention can be larger than 30. Preferably their length is larger than 40 or even 50. Pillars providing such large aspect ratios are advantageous for applications, requiring large electrode surface area per unit substrate area. This will be further detailed in embodiments described hereafter.

FIG. 2 shows a number of alternative cross sections of pillars according to the invention. All of the corresponding pillars can be conceived to comprise a central part called shaft or web 226 and two or more protrusions 222, in the shape of flanges. The shaft cross-section may be circular (FIG. 2A), rectangular (FIG. 2B), square (FIGS. 2E and 2F), or a triangular (FIGS. 2D and 2I). Furthermore, the pillars may have two protrusions (FIGS. 2A, 2B and 2C) or more (FIGS. 2D to 2I). The protrusions may be straight, bent (FIG. 2H), differently sized (222 versus 222" in FIG. 2I) and/or split (222' FIG. 2I). Furthermore, the protrusions may have different orientation, determined by a first angle of inclusion 232, defined by a first region 228 and a second region 230 of the sidewall surface (FIGS. 2B and C). The angle 232 may be between two protrusions, or between a protrusion and the shaft.

Figure 2A:
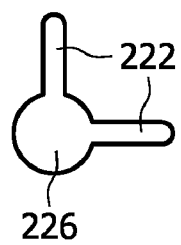
FIGS. 2A to 2J show cross sections of pillars with different profiles.
Figure 2B:
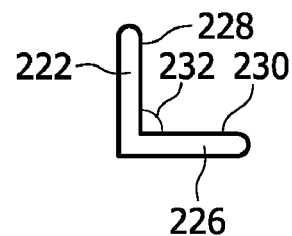
Figure 2C:
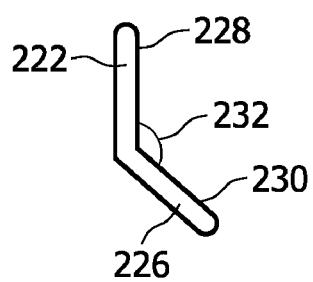
Figure 2D:
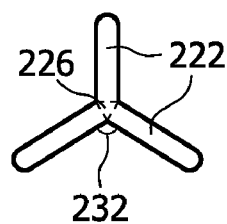
Figure 2E:
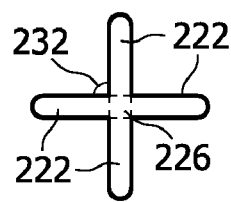
Figure 2F:
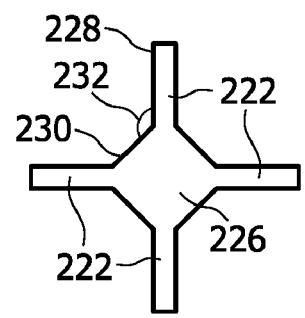
Figure 2G:
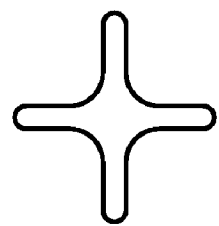
Figure 2H:
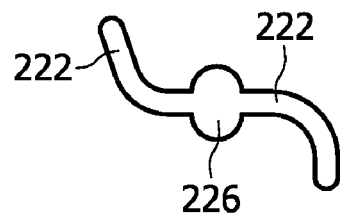
Figure 2I:
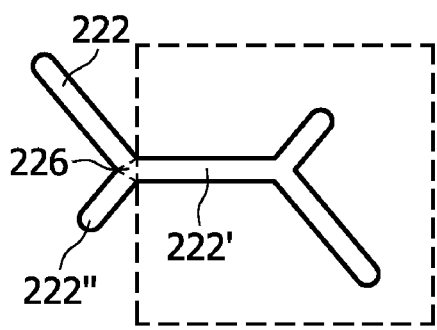
Figure 2J:
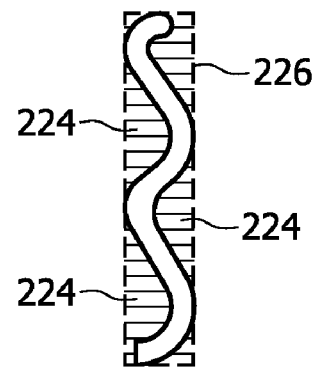

A somewhat different geometry results from pillars having a plate like geometry. They may be conceived as having a central part having multiple protrusions for stability. The plate may be straight or bent and the protrusions may be placed at regular intervals within the cross sections or not. Alternatively, pillars may have a more solid plate central part 226 structure having multiple scores at regular or irregular intervals. Such pillars may form corrugated plates having sharp or rounded creases or bends (FIG. 2J). The plate-like pillars may be branched or not. They preferably do not form small cavities obstructing etching or material deposition processes.

Those skilled in the art will be able to think of many other shapes within the spirit of the invention.

The shape of the pillar, as reflected in its cross sectional profile, is important for several reasons. Firstly, it determines the strength of the pillar with respect to transverse loads or forces, i.e. those loads or forces that have a force component perpendicular to the first direction and in the plane of the cross section. The directional reinforcement is related to the relative position and shape of a shaft, and its protrusions and/or scores. For example, the pillar shown in FIG. 1A is reinforced against transverse load having a component in the plane of drawing. However, in for example the direction perpendicular to the plane of drawing, the strength of the pillar is less increased. Reinforcement in this weaker direction would require that the pillar have at least one other protrusion, extending in a different direction than the first one as for example is the case for the pillar having the cross section of FIG. 2A. Similar reasoning holds for pillars having one or more scores or a mixture of scores and protrusions.

Secondly, the shape of the pillar determines the amount of extra sidewall surface area gained compared to the conventional non-profiled pillar. The length of the perimeter of the profile or contour line of a cross section is dependent on the shape of the profile.

Thirdly, the shape of the sidewall surface influences the deposition of material layers on the sidewall surface. Sharp edges and creases within the surface of the electrode obstruct or deteriorate conformal deposition of materials and reduce the chemical and/or physical quality of such layers. Compare for example pillars having cross sections as depicted in FIGS. 2B and 2C. The angle of inclination 232 may be sharp (FIG. 2B), or obtuse (FIG. 2C). Since the two abutting regions 228 and 232 form a crease running along the length of the pillar at the position where the regions join, the angle 232 indicates whether the crease is sharp or obtuse. Materials deposition as well as etching of pillars becomes slower and less uniform when the angle 232 decreases. Preferably, all creases within a sidewall surface have obtuse inclination angles. This is especially important when applications require thin layers to cover the surface in a step conformal way. Furthermore, since the pillar is part of an electrode, sharp edges or corners are best avoided for reasons of spurious electrical field and associated malfunction of the device comprising the electrode. Symmetry of the pillar, which is reflected in its cross section, can be of importance, i.e. the profile of FIG. 2E has sharp angles, but the one from FIG. 2D does not. In this respect, the orientation and the cross-sectional dimensions of the protrusions with respect to those of the shaft can be used to avoid the sharp angles and creases. Thus, while the pillars corresponding to the cross sections of FIGS. 2E and 2F both have a square shaft 226, the angle 232 is sharp in FIG. 2E, but obtuse in FIG. 2F.

Improved material deposition on the pillar and etching of the pillar is obtained when the sidewall surface of the pillar is smooth. Corners may be rounded to circumvent the presence of sharp angles. Compare for example the cross-shaped cross sections of FIGS. 2E and 2G. However, the smoothness of a surface is separated from whether or not obtuse angles 232 are involved. A sharp crease with an obtuse angle 232 can still be problematic.

Fourthly, the shape of the pillar determines the ability for arranging the pillar in an array. Pillars with symmetrical cross sectional profiles are more efficiently arranged in terms of (substrate) area occupied by the array. However, a particular symmetry can be more advantageous for other reasons as well. This is further detailed with the aid of FIG. 3.

Figure 3A:
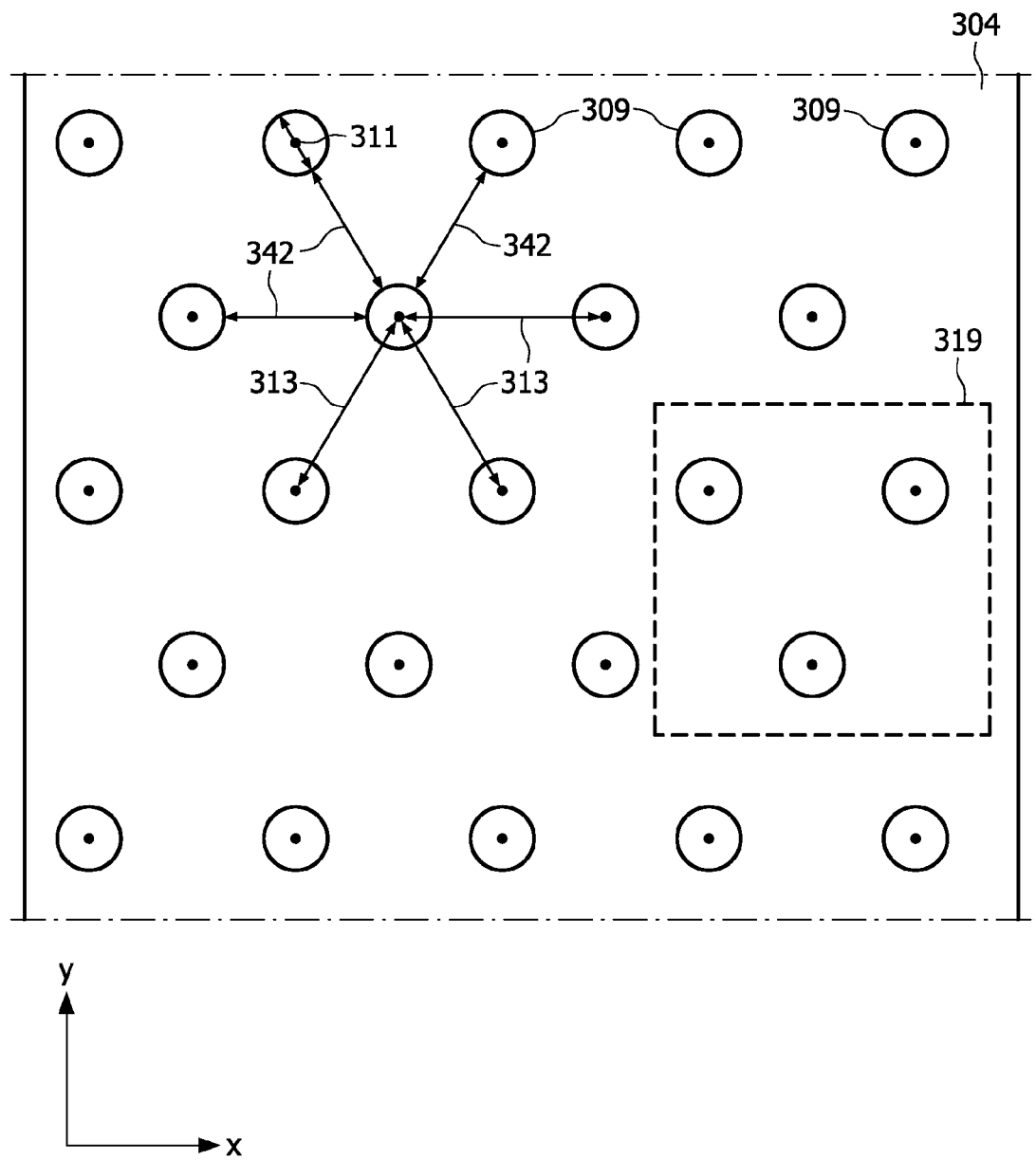
FIGS. 3A to 3C represent arrays of pillars in cross sectional view.

According to prior art, FIG. 3A shows a cross sectional view of an array of conventional pillars 309, i.e. pillars according to prior art having a solid circular cross section with a diameter 311. The pillars are ordered in a hexagonal lattice in a plane extending in the directions X and Y as indicated. The pitch 313, defined as the distance between the centers of two nearest neighbor pillars 309, is identical in all lattice translation directions. Thus, also the space 342, being the distance between the surfaces of two nearest neighbor pillars is identical in these lattice directions.

The pillars are made by etching material from between the pillars in a direction perpendicular to the directions X and Y. If, by too deep etching, the aspect ratio, defined as the ratio of the length of a pillar and its diameter 311, becomes too large, the pillar will break or topple over under transverse load or shear forces. In order to prevent this, either the etch depth must be decreased or the diameter 311 of a pillar 309 increased. These measures will either decrease available surface area of the pillars and/or increase the area occupied by the pillars in the X-Y plane, which for example could be the substrate surface area of an element or device.

Figure 3B:
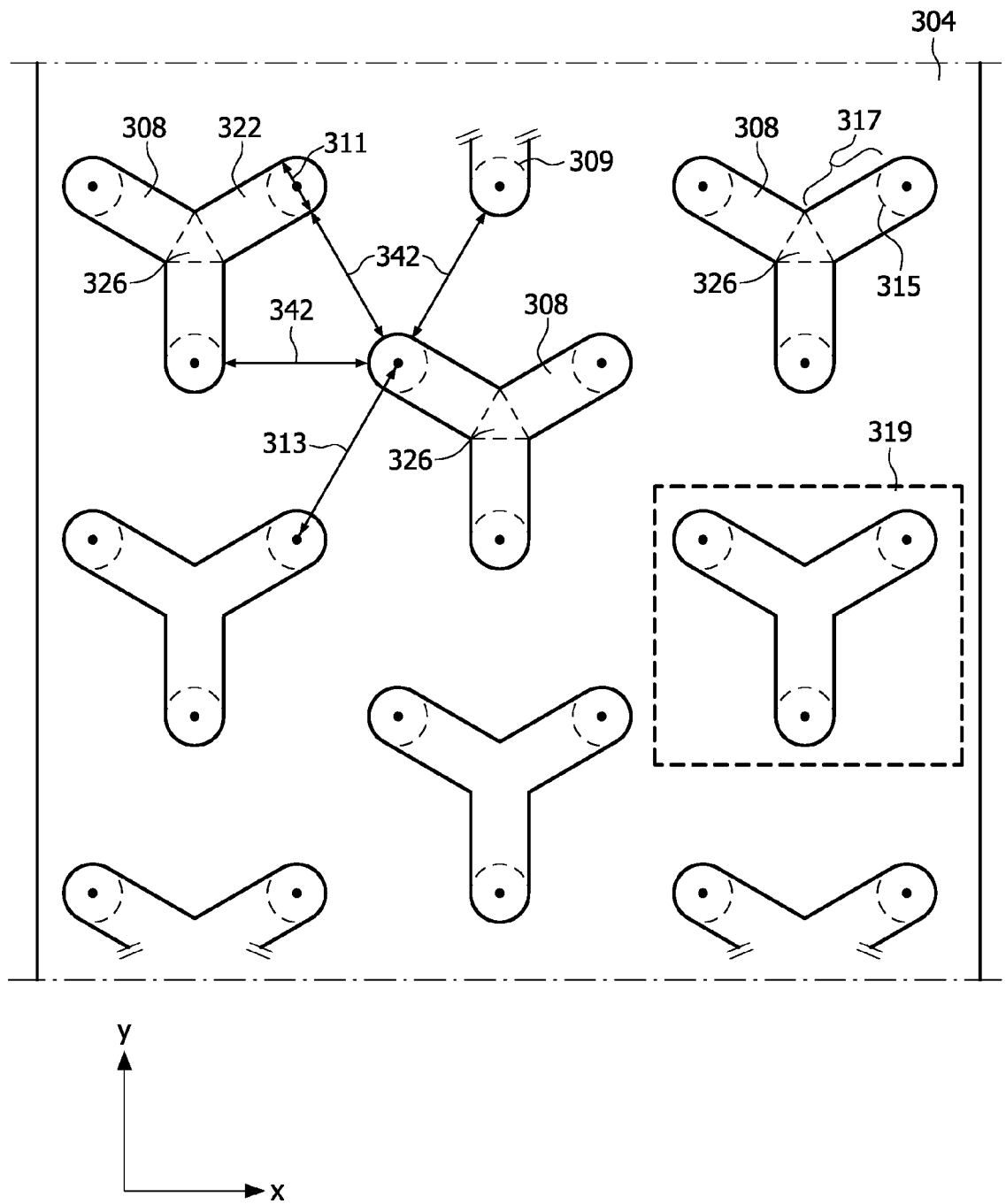

The problem is solved by using pillars according to the invention. Thus, in FIG. 3B, a number of the conventional pillars 309 of FIG. 3A, represented by dashed circles in FIG. 3B, are connected with each other to form pillars 308 having a tripod-like cross section. Such a pillar can be conceived as being constructed from a shaft 326 with a triangular cross section, having three protrusions 322 along its length. The thickness of the protrusion of the pillar 308 is kept the same as the diameter 311 of the conventional pillar 309. Therefore, the pillar 308 is stronger than conventional pillar 309, which allows it to have larger aspect ratio. However, note also that all spaces 342 and pitches 313 are the same as in FIG. 3A. Moreover, if the dimension 311 and the pitch 313 have been chosen such that the lost dashed part 315 of the circumference of a cross section of a conventional pillar 309 is at least compensated for by the gained sides 317 of a protrusion, the surface of the sidewall of the pillar 308 does not decrease. Therefore, the array of pillars of FIG. 3B has the same or larger electrode surface area per unit area 319 in the X-Y plane, compared to the array of FIG. 3A. In addition, due to the space between pillars not being substantially altered with respect to the conventional situation, etch times are not increased. If the length and diameter of the protrusion is made smaller such that the aspect ratio is not altered, the same electrode surface area as in the conventional situation is obtained, but in shorter etch times.

Figure 3C:
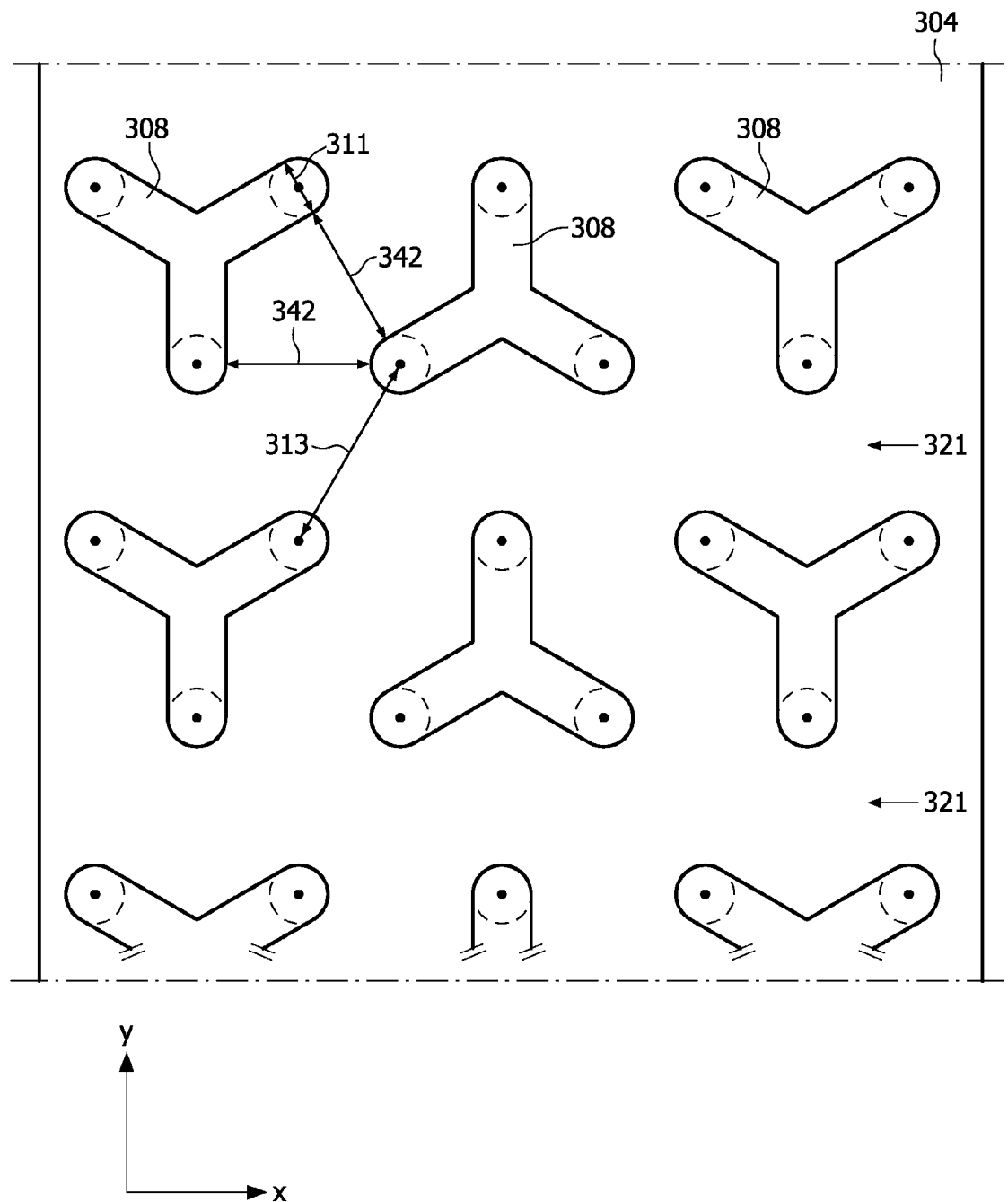

A comparison of FIGS. 3B and 3C shows that pillars 308 may be ordered such that different array symmetries result. These differences result in the distribution of free space around each pillar to be different too. The free space in the array of FIG. 3B is more homogeneously distributed than that within the array of FIG. 3C. For example, in the array of FIG. 3C straight canals 321 of free space extending in the X-direction are present while they are absent in the array of FIG. 3B. The free space distribution is preferably as homogeneous as possible in order to provide homogeneous fluid or gas dynamics during etching and or material deposition on top of a pillar.

The principle described above can be used for different shapes and arrays of conventional pillars leading to different connectivity of conventional pillars and thus different symmetry of the pillars according to the invention. Preferably, pillar cross sectional profiles as discussed above are taken into account. The number of pillars connected, as well as the connectivity pattern may be chosen according to desire. Thus, for example pillars 308 of FIG. 3B or 3C may be further interconnected to form linear connectivity schemes. An example would be the formation of pillars having zig-zag cross sectional pattern or corrugated plate like pillars. Also branched pillars having branched cross sectional patterns can be formed. However, the connectivity must be such that no closed pores are formed within the substrate comprising the pillars, since then the processing conditions are deteriorated. In addition, the possible deposition of material layers on top of pillars depends on the same available space for the same reasons.

If the pillars are sunk into a substrate, for example if they are situated within a trench, cavity or pore, it is preferred that the cross sectional profile of the edge of the trench is adapted to that of the pillars in view of the space arguments in relation to etch and deposition chemistry described above. Alternatively, space available is such that nearby structures do not influence the etching or deposition behavior. This would for example apply to pillars on top of a surface and not sunk into trenches, or cavities or pores.

Figure 4A:
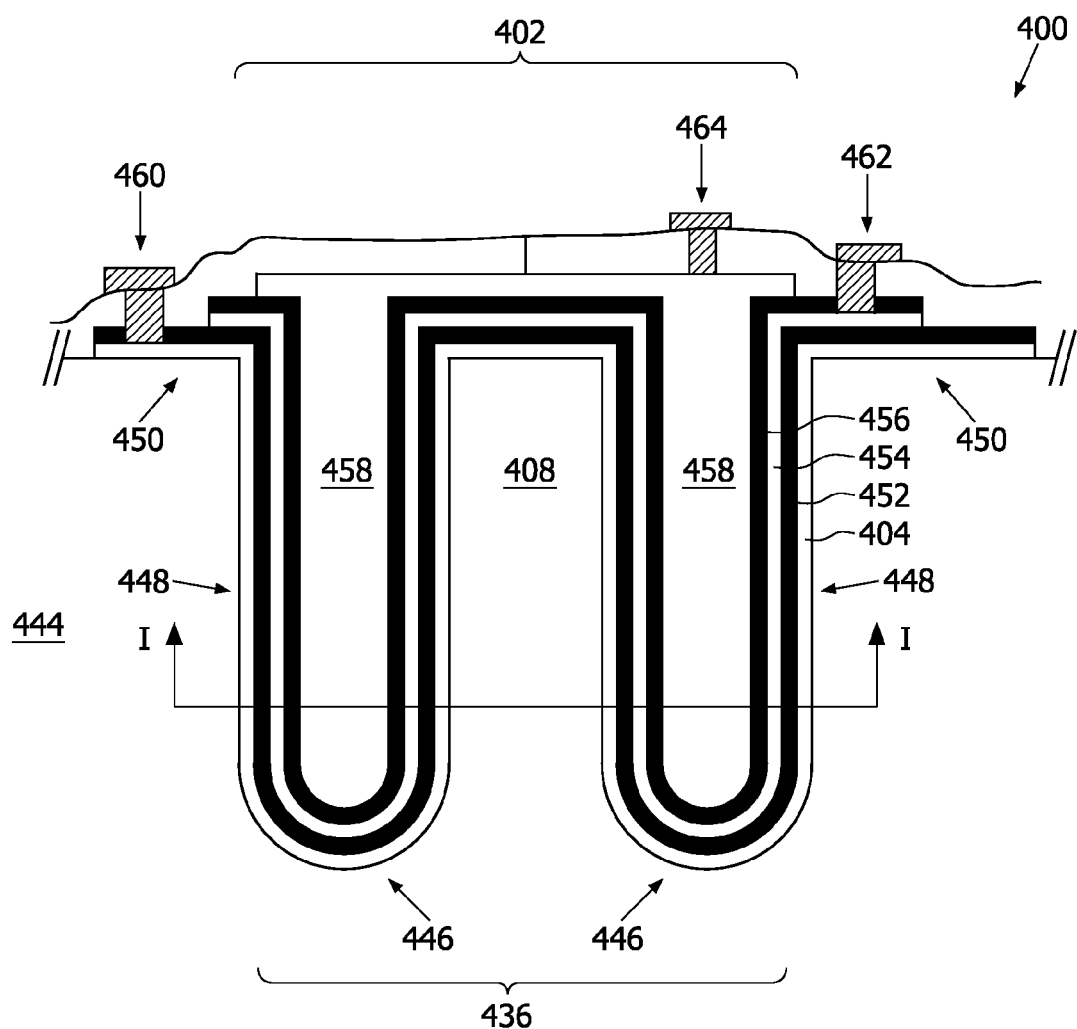
FIGS. 4A and 4B represent a device according to the invention comprising an element having a pillar in a trench.

In an embodiment shown in FIG. 4, the element 402 has been formed in a trench 436 in a substrate 444. Herein the term substrate is to be conceived in the broadest sense possible. It may be a single material substrate of any kind, but it may equally well represent a complex substrate comprising all sorts of materials and prefabricated structures as in processed silicon wafers.

Figure 4B:
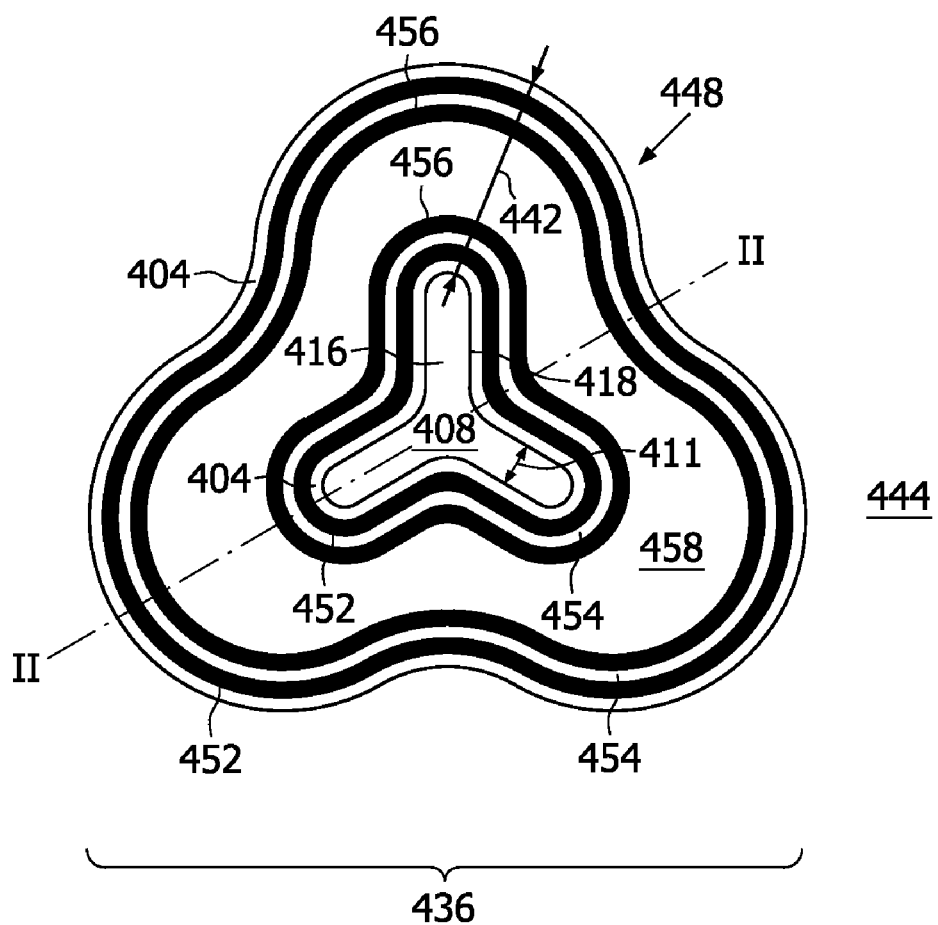

The trench has edge walls 448 and a rim 450. Using an anisotropic etching procedure and a lithographically defined suitable hardmask, the trench 436 has been created such that it comprises a pillar 408. As shown in FIG. 4B the pillar 408 has a cross section 416 with a tripod-like profile 418 and the contour of the edge wall 448 of the trench follows the profile 418 such that the space between pillar sidewall surface and other neighboring pillars or a trench edge wall is substantially equal around the pillar. In that case the etch and/or deposition speed is similar around the pillar.

The pillar 408 has a length that is substantially the same as that of the depth of the trench 436 or the height of the edge wall 448. Alternatively, the pillar may be higher or lower than the trench depth. The trench can be etched with anisotropic etching techniques as known to those skilled in the art. Etch depth is dependent on etch time, which is dependent on the aspect ratio of the pillars to be made and the space between them. The aspect ratio of a pillar may have a typical value of between 10 and 40. It may also be smaller, but preferably is larger than 50.

The trench 436 comprises a filling formed by an alternating layer stack. The stack includes a first electrode 404, a first auxiliary layer 452, an additional electrode 454, an additional auxiliary layer 456 and a second electrode 458. The stack covers the surface of the pillar 408 including its top as well as the surfaces of the bottom 446, edge-walls 448 and rim 450 of the trench 436. The first auxiliary layer 452 separates the first electrode 404 from the additional electrode 454, which in turn is separated from the second electrode 458 by the additionally auxiliary layer 456.

The amount of layers in the stack is not limited to the number above and additional electrodes and/or auxiliary layers or other layers can be added according to need. Alternatively, layers can be omitted. For example, referring to FIG. 4 the additional electrode 454 and the additional auxiliary layer 456 can be omitted, so that the stack comprises three layers, such that the first electrode 404 and second electrode 454 are separated by the first auxiliary layer 452.

In a further variation, the first electrode is part of the substrate 444. For example, the entire substrate may be electrically conducting (low-ohmic) such as to form a suitable first electrode 404. Alternatively, the substrate is electrically resistive (high-ohmic), part of the substrate can be made electrically conducting. This can be for example done by local doping of a semiconductor substrate. This causes that the layer, which originally accommodated the first electrode 404 can be omitted, saving processing cost and time.

According to desire, the electrodes are given electrical contact areas. For example, in FIG. 4A, the first 404, second 458 and additional electrode 454 have their contact areas connected to contact plugs or pads 460, 464 and 462, respectively. These contact areas provide a means for connecting the electrodes of the element 402 to those of other electrical elements of the device 400. If multi conductor layer connectivity is available, such as multilevel metal structures in semiconductor devices, the contacts can be provided on any conductor layer by providing the appropriate plugs through the auxiliary and inter-conductor dielectric layers.

In order to reduce the (parasitic) resistance of the first electrode, such as for reduction of equivalent series resistance (ESR) of an element 402, the contact plug of the first electrode 404 could also be made on the bottom side of the substrate 444, i.e. the opposite of the side comprising the rim 450. In that case, the distance between the pillar and the first contact 460 is reduced. Such a bottom contact can be used with a high- as well as a low-ohmic substrate, although in the high-ohmic substrate some kind of conductive connection to the first electrode 404 must be made. The bottom contact is especially advantageous and effective when arrays of pillars are used, since then a side contact will be relatively far away from the pillars in the center of the array, which may increase equivalent series resistance (ESR) of an element comprising the electrode.

The shape of the trench 436 and pillar 408 are such that their surface is smooth. Sharp edges in the electrodes are avoided and therewith, conformal deposition of the layer stack materials is improved. If element 402 is for example a capacitor, the breakdown voltage is increased. The actually needed breakdown voltage will be dependent on the application of such a capacitor. Thus, if used for example as a decoupling capacitor, the element can be configured to typically handle voltages in the range of tens of volts, while use as a storage capacitor in for example DRAM would require much lower voltages and a different configuration of the element.

The element 402, as described here before in general terms, can be used for different purposes in the device 400 by configuring its features such as for example the shape of trench 436 and/or pillar 408, the amount of pillars as well as the physical and electrical properties of the electrodes and auxiliary layers. In the following paragraphs, a number of exemplary embodiments are described in more detail.

In an embodiment, the element of FIG. 4 is a capacitor. The capacitor is made in a high-ohmic (1000-1500 Ωcm) silicon wafer substrate in order to prepare a capacitor with a high capacitance per unit substrate area. The auxiliary layers electrically insulate the electrodes from each other. The element of FIG. 4 is referred to as having a metal-insulator-metal-insulator-metal (MIMIM) stack. Herein, the term 'metal' means any material suitable for functioning as an electrical conductor. The term 'electrical insulator' includes all suitable dielectric materials.

The trenches and pillars are made according to a method as described in for example non-prepublished application 05110488.3 using a dry etching technique such as the Bosch™ directional reactive ion etch (DRIE). Alternatively, an anisotropic wet-etching technique may be used.

The trench is etched to a depth of 40 μm resulting in an equally long pillar. The pillar has a diameter 411 of 1.2 μm and a space 415 of 1 μm. Other dimensions may be chosen according to need.

Electrodes are made from electrically conducting materials, such as: doped polysilicon, or metals, such as for example: Cu, Al, W, Ru, TiN or TaN. Alternatively, other metals can be used as well as organic conducting materials. Preferably, metals are used that are compatible with standard silicon processing and which can be deposited using a low pressure technique such as chemical vapor deposition (CVD) or atomic layer deposition (ALD) giving good step-conformal deposition of material. Also wet chemical deposition, (e.g. electroless seed deposition in combination with electrochemical deposition may apply here).

The conductivity of the electrode layers is governed by the specific conductivity of the electrode material and the thickness of the electrode layer. The thickness of the metallic layers is in the range between 50 and 100 nm. Those of polysilicon and/or organic conducting materials may be higher than 250 or even 500 nm, depending on the doping level and the generally lower conductivity of the organic materials.

In the present embodiment, the first electrode 404 is an LPCVD deposited polysilicon layer, which is n-doped ($n^{++}$) in situ. Alternatively, it may be doped afterwards using an implantation step according to processes known to those skilled in the art. Alternatively, the first electrode can be embedded within the high-ohmic silicon substrate 444 by a direct masked dope material implantation step. This saves one deposition step for layer 404. Preferably, the entire volume of the pillar is doped to lower its electrical resistivity. The preparation of the first electrode may be omitted altogether by choosing a suitable low-ohmic substrate, such as a p-type doped silicon wafer.

Suitable dielectric materials include any electrically isolating inorganic or organic material. Suitability refers on one hand to compatibility with manufacturing technology and on the other with electrical properties of the materials such as the relative dielectric constant (k), leakage current density and breakdown field.

Current leakage and breakdown generally prescribe a minimum thickness for the dielectric layer, which is different for various materials. Typically, the thickness of the dielectric layers is in the range between 10 and 30 nm.

If the thickness of the dielectric layers is set, the actual capacitance per unit electrode surface area is then determined by the relative dielectric constant k. The higher k is, the higher the capacitance of the capacitor will be. High-k (k>10) materials such as hafnium oxide ($HfO_2$) or ($Ta_2O_5$) or mixed oxides of the perovskite class of materials such as lead titanate may be used.

Alternatively, silicon oxide and silicon nitride may be used for a dielectric. In the present embodiment, all dielectric layers consist of a nominally 30 nm thick stack of layers of silicon oxide-silicon nitride-silicon oxide and is therefore called an ONO stack. The ONO stack of the first auxiliary layer 452 or dielectric layer is prepared by first growing a thermal oxide on top of the polysilicon first electrode 404, followed by a low-pressure CVD (LPCVD) silicon nitride layer and a second tetraethylorthosilicate (TEOS) LPCVD silicon oxide layer.

The second electrode 458 may comprise the materials as described for the first electrode 404. In the present embodiment, a polysilicon layer is n-doped in situ with phosphorus during LPCVD deposition of polysilicon.

A furnace annealing step of 30 minutes at 1000° C. is used to create a polysilicon layer with the conductivity of approximately 1 mΩ*cm. This step may be performed after each polysilicon deposition or after the entire stack of layers has been finished.

If no further layers are present, at this stage a MIM capacitor stack is finished after adding suitable conductor contact pads 460 to 464. The capacitor can be electrically connected to other elements using electrical interconnect structures, such as the aforementioned multilevel metal structures known from semiconductor devices. More detailed connection possibilities are found in the non-prepublished application 05110488.3 or WO2004/114397. The anneal step preferably is done before contact pad metal deposition, for compatibility reasons with high temperatures involved in semiconductor processes.

However, to the MIM stack additional dielectric and electrode layers can be added before preparation of the contact pad or interconnect structures. Thus, in another embodiment of FIG. 4, before preparing the contacts 460 to 464, on top of the first MIM stack, an additional ONO stack is prepared after which another LPCVD layer of in situ doped polysilicon is deposited as the second electrode 458.

Capacitive elements of the MIM type as described here above having ONO dielectric layers may have a capacitance per unit substrate area larger than 50 $nF/mm^2$. Preferably, the density is larger than 70 and even more preferably it is larger than 100 $nF/mm^2$. In the case a MIMIM stack is present the density may be larger than 150 $nF/mm^2$ or even 250 $nF/mm^2$. However, using different design and/or high-k materials, higher values are achievable.

In case of the MIMIM stack the extra thickness may be used to increase breakdown voltages, by disconnecting of the central or internal electrodes of the capacitor.

In yet another embodiment of FIG. 4, the element 402 is an electrochemical energy source such as a Li-ion (micro)battery or a NIMH battery. Detailed information on such energy sources integrated on a silicon substrate is described in for example WO2005/027245. For example, to prepare a three-layer stack Li-ion micro battery incorporating an electrode according to the invention, the first electrode 404, which is the negative electrode of the energy source, is made of conducting polysilicon. The first electrode 404 could be embedded in the substrate 444. Then the first auxiliary layer 452 is an approximately 1 micrometer thick solid state electrolyte such as Lithium Phosphorus Oxynitride (LiPON). On top of this layer, the second electrode 458 is made of $LiCoO_2$, possibly mixed with carbon fibers. The second electrode 458 is the positive electrode of the electrochemical energy source. The additional electrode and auxiliary layer of FIG. 4 are not used. Optionally, a current collector can be coupled to the positive electrode. The deposition of the electrolyte and the electrode layers occurs through conventional techniques, such as physical vapor deposition, CVD or ALD.

The electrode according to the invention may provide a large surface due to the high aspect ratio pillar, therewith providing an energy source as depicted in FIG. 4 with improved (maximized) rate capability and power density. The performance of the energy source is optimized by minimizing the layer thickness of the electrolyte and maximizing the mutual contact surface between the layers.

The three-layer stack can be extended with additional electrolyte layers and electrodes in a way as described for the capacitor here above.

In another embodiment, the element 402 is a rectifying element, such as a PN-diode, PIN-diode, light-emitting diode, photo diode or the like. Thus, the auxiliary layer 452 may consist of a stack of two in situ doped polysilicon layers, wherein the doping is of opposite types. Those skilled in the art will be able to prepare such an element within a device 400 using standard semiconductor materials and methods. The element may be of a two-electrode configuration or a multi-electrode configuration as described for the capacitors and energy sources.

In one embodiment, the elements as described above having more than two electrodes may consist of multiple sub-elements. Examples can be found in the non-prepublished application 05110488.3. For example, the MIMIM capacitor consists of two stacked MIM sub-elements. Electrically, such sub-elements can be connected or coupled in parallel or in series. Herein, connected means short-circuited while coupled means connected via other passive or active elements. Passive elements include for example capacitors, resistors and inductive elements comprising for example coils. Active elements include switches, such as for example MEMS switches, transistors like MOS and MESFETs and bipolar transistors, or diodes such as: PIN diodes and the like. The numerous possibilities allow the fabrication of distributed and/or tunable and/or switchable capacitors to be made with high capacitances on small substrate area. Similarly, the electrodes of batteries can be connected or coupled to have larger endurance (parallel connection), or higher voltage (series connectivity). Switchable voltage is also possible in case of series energy sources.

Alternatively, some or all, additional electrodes are left floating effectively connecting all MIM capacitors in series. Breakdown voltages can be increased therewith. Sometimes the first electrode is not connected at all, or connected to ground. This reduces substrate effects.

In an embodiment, a single element may include a plurality of pillar electrodes arranged in an array such as for example shown in FIG. 3. The pillar electrodes may be electrically short-circuited in order to increase the output of the element, which can be for example capacitance, energy, or current depending on the nature of the element.

In an embodiment, a device includes a plurality of elements of the same type, such as capacitors. The geometry of the first electrodes can be advantageously used to prepare the plurality of different elements in one single process flow without having to use additional process steps. Specifically, by adjusting the shape of pillars or the space available between pillars and surrounding structures, the surface area of the first electrodes of the capacitors is conveniently differentiated.

Figure 5A:
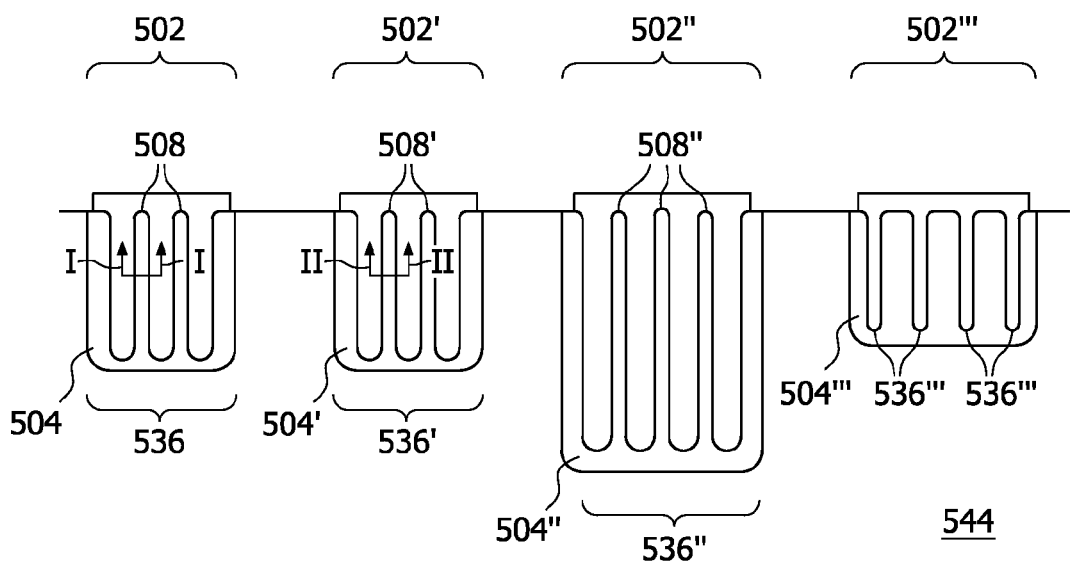
FIGS. 5A and 5B show a device having elements with electrodes of different surface area made in the same process step.
Figure 5B:

The differentiation of the geometry of the first electrode is advantageously done in one process step by giving the first electrodes a different design as exemplified in FIG. 5 showing different elements 502, 502', 502" and 502'" within the device 500 having a substrate 544. In this case, the first electrodes 504, 504', 504" and 504'" of the elements are integrated in the high-ohmic semiconductor substrate 544 by doping. The first and second electrodes are separated electrically and physically by the first auxiliary layer 552 (not shown), which has been deposited locally using an appropriate masking technique. In this case, it is an ONO dielectric layer stack as described here before.

In a first alternative to accomplish the different design, the elements 502, 502' comprise pillars 508 and 508', which have different shapes and/or cross sectional profiles 516 and 516'. Therewith, the sidewall surface area of a pillar, which is available per unit substrate area, is different. A similar effect can be accomplished by ordering of pillars in arrays according to different symmetry.

In a second alternative, the height of pillars 502' and 502", which have the same cross sectional profile, is different. In this alternative, the height difference stems from different depth of the trenches 536' and 536". As described above, the depth is controlled for example, through different space around pillars giving different etch speed. In this respect, electrodes according to the invention may be combined with those comprising pillars having conventional non-profiled cross section, albeit that etch depth needs to be adapted to their mechanical stability.

In a third variation, elements having different types of electrodes are combined. For example, while element 502 has an electrode comprising a pillar 508, element 502'" has an electrode comprising a trench or pore 536'" without a pillar. Etch depth can independently be influenced by the cross sectional dimension of the trench or pore. In addition, elements having plate electrodes can be integrated.

Preferably, the elements are designed such that all trenches, pores, cavities or pillars have similar depth and length. In that deposition of additional material layers on top of first electrodes occurs with the same speed and quality within the variety of elements.

In an embodiment of a device having a plurality of elements, they are of similar type, i.e. they are for example capacitors or diodes. Alternatively, the elements are of different types. The plurality of elements may be electrically coupled or connected with or without using other passive or active elements as described above, in order to form integrated circuits such that the device is capable of performing specific electrical functions. Such devices are also known as active dies.

Figure 6A:
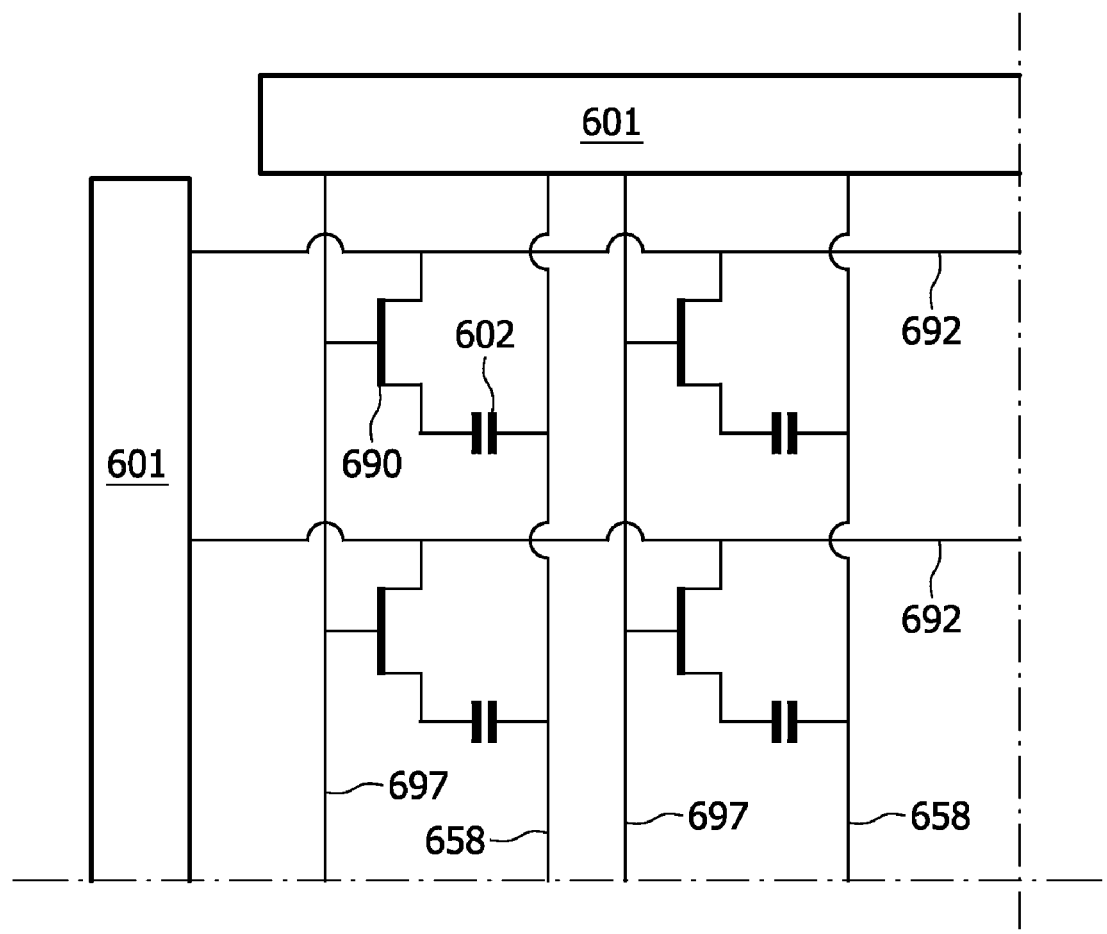
FIGS. 6A and 6B show a DRAM memory circuit and a DRAM memory cell including a capacitor according to the invention.

In an embodiment, the device or active die is an integrated circuit 600 comprising a memory. As shown in FIG. 6A the memory consists of an array of a plurality of memory cells connected between a plurality of wordlines 697, a plurality of bitlines 604 and a plurality of plate lines 658, such that each memory cell is connected between one wordline, one bitline and one plate line. The array of lines is connected to peripheral circuitry 601 for memory array driving according to known methods.

Each memory cell comprises a transistor 690 and a storage capacitor 602. The transistor can be used for selective writing and reading of the individual storage capacitors. As known to those skilled in the art, the data retention time is dependent on the size of the storage capacitor. As the transistor dimensions are ever decreasing, there is a need for preparing increased capacitance per unit substrate area in these memory devices.

Figure 6B:
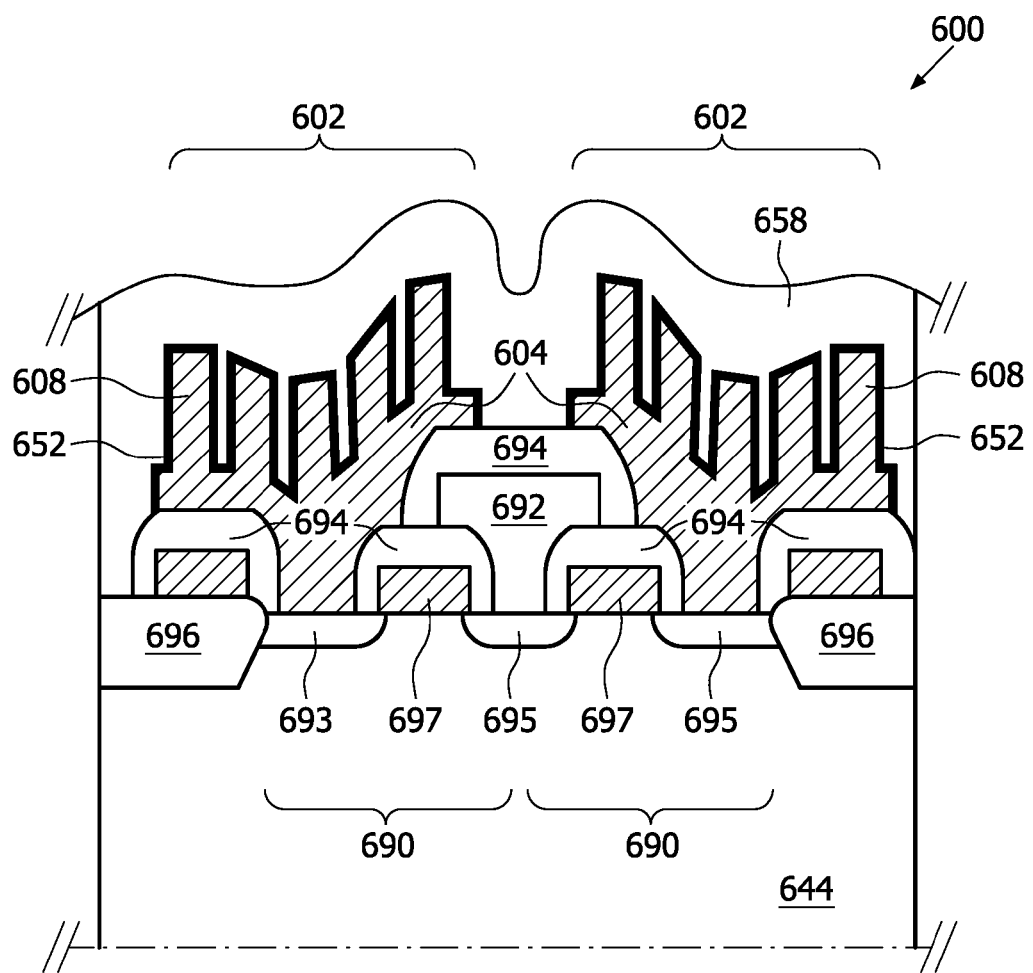

FIG. 6B shows two memory cells in a semiconductor substrate 644 between field oxide 696. Each transistor 690 has a gate 697 for a wordline. The transistors share a channel terminal 695 connected to a bitline. They each have a channel terminal 693 connected to a first electrode 604 having pillars 608 of a storage capacitor 602. All gates and electrodes are electrically isolated by isolation 694. Covering each first electrode 604 is a dielectric layer 652, which electrically isolates the first electrode from second electrode 658, which forms the plate line.

Note that during manufacturing, when the second electrode layer 658 has not yet been deposited, the pillars 608 are free standing structures not embedded within a trench or pore. Hence, their structural advantage will not only translate into higher capacitance density, but also in increased manufacturing yield of the device 600. Due to the relief in the device of the present embodiment, the first surface of the first electrode 604 is not level over the substrate surface and the pillars do not extend perpendicularly to this surface.

The capacitors can be designed according to the invention and manufactured according to known semiconductor manufacturing methods such as described in for example U.S. Pat. Nos. 5,821,142, 5,204,280, 5,336,630 or 6,924,526 B2. The capacitors may bear strong resemblance with the ones described here above, albeit, that thickness of electrode layers and/or auxiliary or dielectric layers as well as cross sectional dimensions will be smaller. Those skilled in the art will know how to provide peripheral circuitry into the device for driving the memory array. A device as described will have better data retention characteristics and allows for better down scaling of memory technology.

Other devices or active dies according to the invention include: transceivers, power amplifiers, IC's for TV or mobile applications, filters, matching units, charge pumps, or DC-DC converters. Those skilled in the art will know other applications.

In an embodiment, the device is a passive die, also known as a platform device or interconnect device. The interconnect device enables electrical interconnection of one or more active dies or other passive dies in order to realize complex electrical functions in so called assemblies of semiconductor devices. The assemblies are also known as system in a package. Such functions can be made in a cost effective way in these assemblies, since not all electrical functions need to be realized in a single die, which would require one very complex and expensive manufacturing process. Thus, for example the dies to be interconnected are prepared using different optimized processes. Assembly is done in a separate process.

FIG. 7 shows in diagrammatical cross-sectional view an example of an assembly 780. The assembly 780 includes an active device 700, an interconnect device 782. The assembly makes use of a double flip chip construction, in which the device 700 is electrically connected to the interconnect device 782 through bumps 786 and the interconnect device 782 is electrically connected to the leadframe 784 through bumps 788. Bumps 786 are for example gold bumps, while the bumps 788 are for instance solder bumps of SAC (tin-silver-copper alloy). The electrical interconnection is a through substrate connection by virtue of the conducting vias 785. The entire assembly is packaged in a mold 789 to form a ready to use system in a package assembly. Those skilled in the art will be able to think of other such assemblies, including those having more than two devices.

Those skilled in the art will think of numerous different assembly structures having devices according to the invention.

Preferably, the interconnect dies, or passive dies such as 782 are made using simpler and cheaper processes than those used for active dies such as 700. Such passive dies may for example be prepared according to WO2004/114397. Moreover, the passive or interconnect die may comprise integrated circuits for performing additional electrical functions employing for example elements according to the invention as described herein before. For example, the passive die may have large capacitors for buffering, or an energy source as described above. Alternatively, coils may be present. Especially a device as a battery is difficult to integrate into an active die prepared by standard CMOS technology, since it requires material layers that are quite uncommon to CMOS manufacturing. In addition to all sort of elements, vias through the substrate of the passive die such as 785 can be integrated. This can be done as disclosed in for example WO2004/114397. The vias enable electrical interconnection between multiple dies present on different sides of the passive die substrate.

The assembly technology is flexible, versatile and cost effective. A device according to the invention will provide a passive die with new, improved and previously unattainable properties, e.g. larger capacitors having capacitance densities of 300 $nF/mm^2$ and beyond, or longer lifetime batteries. Therewith, such devices enable new assemblies for a wider field of application.

It should be noted that the above-mentioned embodiments illustrate rather than limit the invention, and at that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that the combination of these measures cannot be used to advantage.

The invention claimed is:

1. An electric device including an electric element, the electric element comprising a first electrode having a first surface and a pillar, the pillar extending from the first surface in a first direction, the pillar having a length measured from the first surface parallel to the first direction, the pillar having a cross section perpendicular to the first direction and the pillar having a sidewall surface enclosing the pillar and extending in the first direction,
- wherein the pillar comprises any one of a score and a protrusion extending along at least part of the length of the pillar for giving the pillar improved mechanical stability,
- wherein the sidewall surface comprises a first region and a second region adjoining each other along a line extending parallel to the first direction, the first region and the second region defining an obtuse angle of inclination with respect to each other, and
- wherein the pillar comprises three protrusions forming angles of about 120 degrees one with the others, and the pillar has a tripod-like cross-section perpendicular to the first direction.

2. An electric device according to claim 1, wherein the sidewall surface is a smooth surface.

3. An electric device according to claim 1, wherein the cross section has a symmetrical profile.

4. An electric device according to claim 1, wherein the cross section has an area, which is constant along the length of the pillar.

5. An electric device according to claim 1, wherein the cross section has the same shape along the entire length of the pillar.

6. An electric device according to claim 1, wherein the pillar has an aspect ratio larger than 30.

7. An electric device according to claim 1, wherein the first electrode includes a plurality of pillars.

8. An electric device according to claim 1, wherein the electric device comprises a plurality of elements of the same type.

9. An electric device according to claim 1, wherein the electric device comprises a substrate including a semiconductor and wherein the first electrode is part of the semiconductor.

10. An electric device according to claim 1, wherein the electric device is an integrated circuit and the electric element is a memory cell storage capacitor.

11. An assembly comprising an electric device according to claim 1 and at least one integrated circuit, wherein the electric device is electrically coupled to the at least one integrated circuit.

12. An electric device according to claim 1, further comprising a plurality of spaced pillars, the pillars being so ordered that a free space between the pillars is homogeneously distributed.

13. An electric device according to claim 1, wherein the length of the pillar measured from the first surface parallel to the first direction is about 40 µm.

14. An electric device according to claim 1, wherein the electric element comprises a second electrode and a first auxiliary layer, the first auxiliary layer being arranged such as to separate the second electrode from the first electrode.

15. An electric device according to claim 14, wherein the electric element comprises at least one additional electrode and at least one additional auxiliary layer, the at least one additional auxiliary layers being arranged at least partly between the first and second electrodes and the at least one additional electrodes being separated from each other and the first and second electrodes by at least a part of the first and the additional auxiliary layers.

* * * * *